US009322838B2

(12) United States Patent
Kim

(10) Patent No.: US 9,322,838 B2
(45) Date of Patent: Apr. 26, 2016

(54) SUPERCONDUCTING ACCELEROMETER, ACCELERATION MEASURING APPARATUS, AND ACCELERATION MEASURING METHOD

(71) Applicant: Korea Research Institute of Standards and Science, Daejeon (KR)

(72) Inventor: In-Seon Kim, Daejeon (KR)

(73) Assignee: Korea Research Institute of Standards and Science, Daejeon (KR)

(*) Notice: Subject to any disclaimer, the term of this patent is extended or adjusted under 35 U.S.C. 154(b) by 0 days.

(21) Appl. No.: 14/640,372

(22) Filed: Mar. 6, 2015

(65) Prior Publication Data
US 2015/0177271 A1 Jun. 25, 2015

Related U.S. Application Data

(63) Continuation of application No. PCT/KR2013/007463, filed on Aug. 21, 2013.

(30) Foreign Application Priority Data

Sep. 12, 2012 (KR) .................. 10-2012-0101188

(51) Int. Cl.
G01P 15/00 (2006.01)
G01P 15/12 (2006.01)
G01P 15/08 (2006.01)
G01P 15/105 (2006.01)
G01P 1/02 (2006.01)
G01R 1/18 (2006.01)
H02K 7/09 (2006.01)

(52) U.S. Cl.
CPC ............ *G01P 15/0802* (2013.01); *G01P 1/023* (2013.01); *G01P 15/105* (2013.01); *G01P 15/12* (2013.01); *G01R 1/18* (2013.01); *H02K 7/09* (2013.01)

(58) Field of Classification Search
CPC ... G01P 15/0802; G01P 15/105; G01P 15/12; G01P 1/023–1/18; H02K 7/09
See application file for complete search history.

(56) References Cited

U.S. PATENT DOCUMENTS 5,412,988 A * 5/1995 Neff .................. G01P 15/11
324/207.13
5,731,703 A * 3/1998 Bernstein ............... G01R 33/02
324/256

(Continued)

FOREIGN PATENT DOCUMENTS

JP 2001-004651 1/2001
KR 10-2011-0076150 7/2011

OTHER PUBLICATIONS

International Search Report for Application No. PCT/KR2013/007463 dated Nov. 27, 2013.

*Primary Examiner* — Colleen Dunn
(74) *Attorney, Agent, or Firm* — Jenkins, Wilson, Taylor & Hunt, P.A.

(57) ABSTRACT

Provided are a superconducting accelerometer, an acceleration measurement device, and an acceleration measurement method. The superconducting accelerometer includes a test mass including a rod-shaped body part, a disc-shaped coupling part connected to the body part, the test mass being made of a superconductor; a solenoid levitation coil disposed to surround a portion of the body part and adapted to magnetically levitate the test mass, the solenoid levitation coil being made of a superconductor; a measurement superconductor coil disposed at at least one side of an upper portion and a lower portion of the coupling part; and a SQUID sensor adapted to detect current depending on variation of a distance between the test mass and the measurement superconductor coil.

17 Claims, 7 Drawing Sheets

(56) References Cited

U.S. PATENT DOCUMENTS

| | | | |
|---|---|---|---|
| 5,925,822 A * | 7/1999 | Naughton | G01H 11/06 367/103 |
| 6,418,081 B1 * | 7/2002 | Sen | F41H 11/12 181/101 |
| 8,800,371 B2 * | 8/2014 | Chen | G01P 15/125 73/514.18 |

* cited by examiner

SUPERCONDUCTING ACCELEROMETER, ACCELERATION MEASURING APPARATUS, AND ACCELERATION MEASURING METHOD

CROSS-REFERENCE TO RELATED APPLICATION

This application is a continuation of and claims priority to PCT/KR2013/007463 filed on Aug. 21, 2013, which claims priority to Korea Patent Application No. 10-2012-0101188 filed on Sep. 12, 2012, the entirety of which is hereby incorporated by reference.

BACKGROUND

1. Technical

The present invention relates generally to superconducting accelerometers and, more particularly, to a superconducting accelerometer including a solenoid levitation coil.

2. Description of the Related Art

A typical accelerometer is in the form of a test mass that hangs on a spring. When gravity change or acceleration occurs, the test mass moves and the moving amount is output after being converted into a voltage signal.

A superconductor exhibits zero electrical resistance, and its internal magnetic field becomes zero. The latter is called Meissner effect, which is repulsive to an external magnetic field, i.e., has a diamagnetic property. For example, a magnet on a superconductor (a superconductor on a magnet) levitates due to the diamagnetic effect.

When current is applied to a coil made of a superconducting conductor and a closed loop circuit is formed, permanent current flows for infinite time because electrical resistance of the coil is zero. The permanent current and a magnetic field established by the permanent current are also stable extremely.

SUMMARY

Embodiments of the present invention provide a magnetic levitation type superconducting accelerometer without combination with a mechanical spring.

A superconducting accelerometer according to an embodiment of the present invention may include a test mass including a rod-shaped body part and a disc-shaped coupling part connected to the body part, the test mass being made of a superconductor; a solenoid levitation coil disposed to surround a portion of the body part and adapted to magnetically levitate the test mass, the solenoid levitation coil being made of a superconductor; a measurement superconductor coil disposed at at least one side of an upper portion and a lower portion of the coupling part; and a SQUID sensor adapted to detect current depending on variation of a distance between the test mass and the measurement superconductor coil.

In example embodiments, the test mass may further include a neck part disposed between the body part and the coupling part.

In example embodiments, the superconducting accelerometer may further include a superconductor shielding case adapted to surround and magnetically shield a portion of the neck part, the body part, and the solenoid levitation coil.

In example embodiments, the superconducting accelerometer may further include a coil bobbin disposed inside the solenoid levitation coil. The coil bobbin may be made of a ceramic material and fixed to the superconductor shielding case, and the solenoid levitation coil may be wound on the coil bobbin.

In example embodiments, the measurement superconductor coil may be disposed at an upper portion and a lower portion of the coupling part. The measurement superconductor coil may be a pancake-type spiral coil.

In example embodiments, the superconductor shielding case may include a first space in which the body part of the test mass and the solenoid levitation coil are stored; a second space in which the coupling part of the test mass is stored; and a third space in which the SQUID sensor is stored.

In example embodiments, the superconducting accelerometer may include a sealing can adapted to vacuum-seal the test mass, the solenoid levitation coil, the measurement superconductor coil, and the SQUID sensor. The inside of the sealing can be filled with a helium gas after being vacuum-exhausted.

In example embodiments, a material of the sealing can be niobium (Nb).

In example embodiments, the superconducting accelerometer may further include a superconductor shielding case disposed inside the sealing can and adapted to surround and magnetically shield a portion of the neck part, the body part, and the solenoid levitation coil; a fixing plate coupled with an upper surface of the superconductor shielding case; a temperature control heater disposed inside the sealing can; a heat carrier of a flexible material adapted to thermally connect the temperature control heater and the fixing plate to each other; and a temperature sensor coupled with the superconductor shielding case.

An acceleration measurement device according to an embodiment of the present invention may include a dewar in which a coolant is stored; a sealing can disposed inside the dewar and filled with a helium gas after being vacuum-exhausted; and an acceleration sensor disposed inside the sealing can. The acceleration sensor may include a test mass including a rod-shaped body part, a neck part connected to the body part, and a disc-shaped coupling part connected to the neck part; a solenoid levitation coil disposed to surround a portion of the body part and adapted to magnetically levitate the test mass, the solenoid levitation coil being made of a superconductor; a measurement superconductor coil disposed at at least one side of an upper portion and a lower portion of the coupling part; and a SQUID sensor adapted to detect current depending on distance between the test mass and the measurement superconductor coil.

In example embodiments, the acceleration measurement device may further include a superconductor shielding case disposed inside the sealing can and adapted to surround and magnetically shield a portion of the neck part, the body part, and the solenoid levitation coil; and a fixing plate coupled with an upper surface of the superconductor shielding case.

In example embodiments, the acceleration measurement device may further include three level-maintaining strings connected to a corner of a regular triangle matching a disc-shaped fixing plate; and level-maintaining strings connecting the sealing can the dewar to each other to extend the level-maintaining pipes, respectively. A level of the sealing plate may be adjusted by adjusting lengths of the level-maintaining strings.

In example embodiments, the acceleration measurement device may further include a vacuum pipe connecting the sealing can with the dewar to each other. The inside of the sealing can be vacuum-exhausted through the vacuum pipe.

An acceleration measurement method according to an embodiment of the present invention may include cooling a test mass including a rod-shaped body part, a neck part connected to the body part, and a disc-shaped coupling part connected to the neck part and made of a superconductor, a solenoid levitation coil disposed to surround a portion of the body part and made of a superconductor, and a measurement superconductor coil; applying first permanent current to the solenoid levitation coil to levitate the test mass; applying second permanent current to the measurement superconductor coil disposed at least one side of an upper portion and a lower portion of the coupling part; and detecting variation of the second permanent current depending on acceleration variation by the SQUID sensor.

In example embodiments, the acceleration measurement method may further include adjusting the solenoid levitation coil, the test mass, and the measurement superconductor coil to be maintained at constant temperature below critical temperature; vacuum-exhausting a sealing can disposed inside a dewar in which a coolant is stored before filling the sealing can with a helium gas; and maintaining levels of the solenoid levitation coil, the test mass, and the measurement superconductor coil.

In example embodiments, applying the first permanent current to the solenoid levitation coil to levitate the test mass may include heating a portion of the solenoid levitation coil to critical temperature or above; applying current using a current source; and removing the current source.

In example embodiments, applying the second permanent current to the measurement superconductor coil may include heating a portion of the measurement superconductor coil to critical temperature or above; applying current using a current source; and removing the current source.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present invention.

DETAILED DESCRIPTION

Figure 1A:
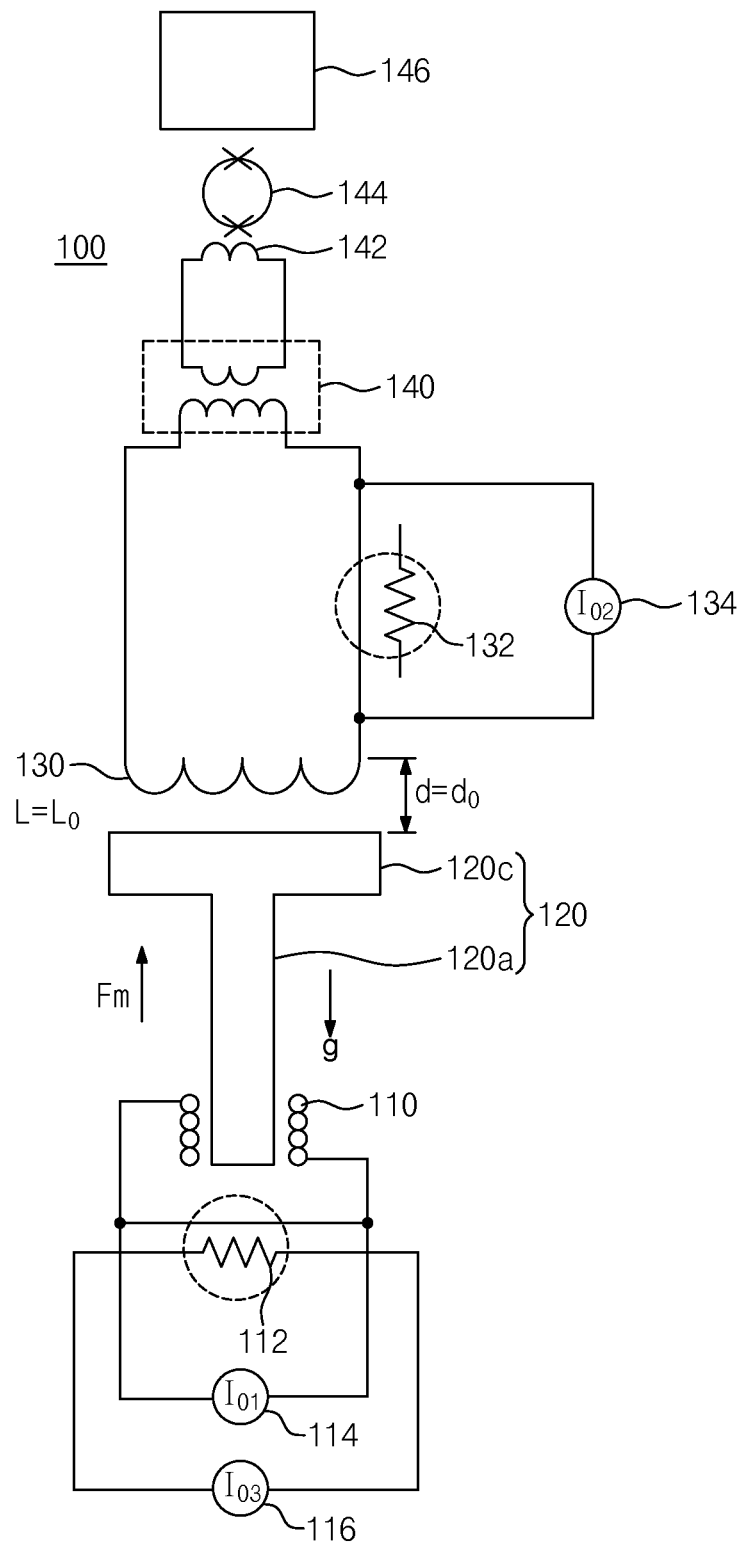
FIGS. 1A and 1B are equivalent circuit diagrams of an acceleration sensor according to an embodiment of the present invention.

The basic principle of all acceleration sensors is that a test mass moves when acceleration change occurs and the moving distance (micro-displacement) is measured.

According to the present invention, a test mass is magnetically levitated using a superconducting phenomenon. When a test mass made of a superconductor moves, inductance of a measurement superconductor coil disposed adjacent to the test mass changes. The change of the inductance changes current flowing to the measurement superconductor coil to constantly maintain stored energy. Thus, the current flowing to the measurement superconductor coil changes a magnetic field and the current or the magnetic field is transformed into a voltage through a voltage transformer or a current transformer by a SQUID sensor.

If the measurement superconducting coil is a pancake-type spiral coil, a measurement area may increase and inductance change depending on micro-displacement of the test mass may be efficiently detected.

A superconducting accelerometer according to an embodiment of the present invention levitates a test mass using electromagnetic force so that a mechanical spring coupling that is the biggest obstacle is removed. In addition, the test mass includes a body part, a neck part, and a coupling part. The body part has a shape suitable for superconducting magnetic levitation, and the coupling part has a shape suitable for coupling with a measurement superconductor coil. The neck part is designed to minimize a leakage magnetic field. The neck part with a small diameter is disposed through a superconducting magnetic shielding case to minimize leakage of a magnetic field established by a solenoid levitation coil to the measurement superconductor coil. The body part is partially inserted into the solenoid levitation coil to magnetically levitate the test mass, maintain stable posture, and free from interferences of front, back, left, and right directions.

The measurement superconductor coil is disposed at both sides of the disc-shaped coupling part in the form of a spiral pancake. Thus, a difference between currents generated at each of the measurement superconductor coils is summed up to induce an amplification effect Since a superconductor is characterized in that magnetic field penetration depth varies depending on temperature variation, a sealing can of a superconductor material seals the overall accelerometer in a vacuum state. The sealing can include niobium (Nb). The sealing can blocks introduction of a magnetic field from the exterior using superconducting shielding characteristics. When a very small amount of helium gas is injected into the sealing can, the helium gas cools the accelerometer due to continuous heat transfer with liquid helium outside the sealing can. Under this state, a temperature sensor mounted on the accelerometer measures a temperature. When the measured temperature drops below a predetermined reference temperature, a temperature control heater transfers energy to the accelerometer through a flexible heat carrier such that the measured temperature is precisely controlled to be maintained at the predetermined reference temperature. That is, the variation of the magnetic field penetration depth of the superconductor depending on the temperature variation is minimized The present invention will now be described more fully hereinafter with reference to the accompanying drawings, in which embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Figure 1B:
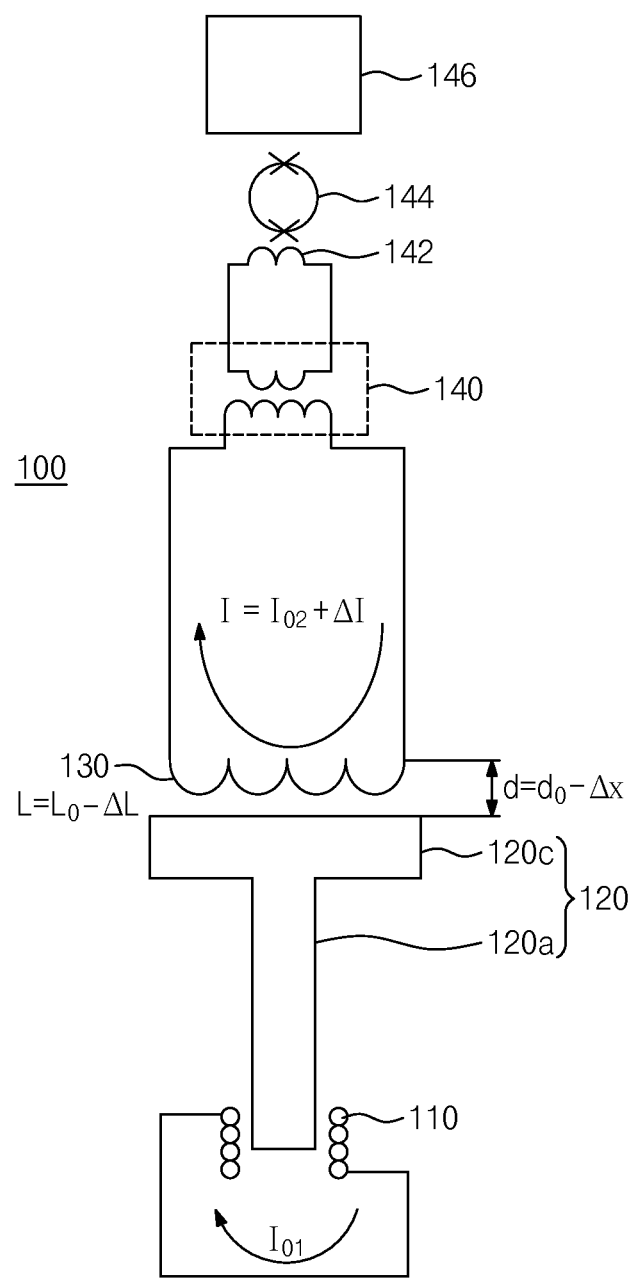

FIGS. 1A and 1B are equivalent circuit diagrams of an acceleration sensor according to an embodiment of the present invention.

Referring to FIGS. 1A and 1B, a superconducting accelerometer 100 includes a test mass 120 that includes a rod-shaped body part 120a and a disc-shaped coupling part 120c connected to the body part 120a, a solenoid levitation coil 110 that is disposed to surround a portion of the body part 120a, magnetically levitates the test mass 120, and is made of a superconductor, a measurement superconductor coil 130 that is disposed at least one side of an upper portion and a lower portion of the coupling part 120, and a SQUID sensor 144 that senses current flowing to the measurement superconducting coil 130.

Inductance of the measurement superconductor coil 130 disposed adjacent to the test mass 120 made of a superconductor may be given as below:

$$L = \mu_0 \times n^2 \times A \times d$$

where $\mu_0$ represents vacuum permeability, n represents the number of windings per length of the measurement superconductor coil 130, A represents an area of the measurement superconducting coil 130, and d represents a distance between the measurement superconductor coil 130 and the test mass 120. The inductance is in proportion to the distance between the test mass 120 and the measurement superconductor coil 130. Variation of the distance results in variation of the inductance, and the variation of the inductance results in variation of permanent current flowing to the measurement superconductor coil 130.

The measurement superconductor coil 130 is connected to a voltage transformer 140 or a current transformer. A primary coil of the voltage transformer 140 is directly connected to the measurement superconductor coil 130. The primary coil is a superconductor. A secondary coil of the voltage transformer 140 may be made of a superconductor. The secondary coil may be connected to a pick-up coil 142, and the pick-up coil may be magnetically connected to the SQUID sensor 144. An output of the SQUID sensor 144 may be connected to a signal processor 146. The signal processor 146 may be disposed in an uncooled outside. The measurement superconductor coil 130 and the primary coil of the voltage transformer 140 are connected to each other to form a closed loop.

A first heat switch 132 may be a heat attached to a portion or an interconnection of a superconductor wire of the measurement superconductor coil 130. When the first heat switch 132 emits heat by receiving energy from a current source (not shown), temperature of the superconductor wire rises to superconducting critical temperature or above due to the heat transferred from the first heat switch 132. While the first heat switch 132 is turned off, the superconductor wire goes to a superconducting state to have zero resistance. When the first heat switch 132 is turned on, a heated portion of the superconductor wire loses superconductivity to generate resistance.

While the first heat switch 132 is turned on, an external current source 134 applies predetermined external current to the measurement superconductor coil 130. When the first heat switch 132 is turned off while the external current is applied, the superconducting current flows into a circuit constituting a closed loop. In this case, although the external current source 134 is removed, the predetermined current flows persistently to the closed loop. The persistently flowing current is called superconducting permanent current. The closed circuit stores magnetic energy, and the magnetic energy is conserved.

$$E = \tfrac{1}{2} L_0 I_0^2$$

In order to levitate the test mass 120, the solenoid levitation coil 110 is disposed to surround the lower portion of the body part 120a. The solenoid levitation coil 110 constitutes a closed loop. A second heat switch 112 is disposed in the vicinity of a portion or a connection conductor of the solenoid levitation coil 110. When the second heat switch 112 is turned on, the current source 116 heats the second heat switch 112 and heat energy generated by the second heat switch 112 heats a portion of the adjacent solenoid levitation coil 100 to critical temperature or higher.

While the second heat switch 112 is turned on, an external current source 114 applies predetermined external current to the solenoid levitation coil 110. When the second heat switch 112 is turned off while the external current is applied, the superconducting current flows into a circuit constituting a closed loop. In this case, although the external current source 114 is removed, the predetermined current flows persistently to the closed loop. The persistently flowing current is called superconducting permanent current. The closed circuit stores magnetic energy, and the magnetic energy is conserved. Thus, the solenoid levitation coil 100 functions as a permanent magnet. The test mass 120 is made of a superconductor to exhibit diamagnetism. Thus, the solenoid levitation coil 110 levitates the test mass 120 by applying force (Fm) to the test mass 120 against the gravity (g).

When force is applied to the accelerometer 100 while superconducting permanent current is flows, acceleration variation occurs. Thus, the test mass 120 moves and distance (d) between the test mass 120 and the measurement superconductor coil 130 may decrease ($d = d_0 - \Delta x$). In this case, the inductance of the measurement superconductor coil 130 decreases. Since energy stored by the measurement superconductor coil 130 is conserved, the current flowing to the measurement superconductor coil 130 increases ($I = I_0 + \Delta I$). The current variation may be converted into voltage or current variation. As a result, the accelerometer 100 may convert the acceleration variation into the voltage variation.

In order to operate the superconducting accelerometer 100, the test mass 120, the solenoid levitation coil 110, and the measurement superconductor coil 130 need to be cooled to critical temperature or below.

Then, first permanent current is applied to the solenoid levitation coil 110 to levitate the test mass 120. In order to apply the first permanent current to the solenoid levitation coil 110, a portion of the solenoid levitation coil 110 is heated at critical temperature or above using the second heat switch 112. If the second heat switch 112 is turned off while the current is applied to the solenoid levitation coil 110, the first permanent current may flow to the solenoid levitation coil 110.

Then, second permanent current is applied to the measurement superconductor coil 130 disposed at least one side of the upper portion and the lower portion of the coupling part 120c. In order to apply the second permanent current to the measurement superconductor coil 130, a periphery of a portion of the measurement superconductor coil 130 is heated at critical temperature or above. If the first heat switch 132 is turned off while the current is applied to the measurement superconductor coil 130, the second permanent current may flow to the measurement superconductor coil 130.

Then, the SQUID sensor 144 may detect the variation of the second permanent current depending on the acceleration variation.

In addition, the solenoid levitation coil 110, the test mass 120, and the measurement superconductor coil 130 may be adjusted to be maintained at constant reference temperature below the critical temperature.

In addition, the solenoid levitation coil 110, the test mass 120, and the measurement superconductor coil 130 may be adjusted to maintain level.

Figure 2:
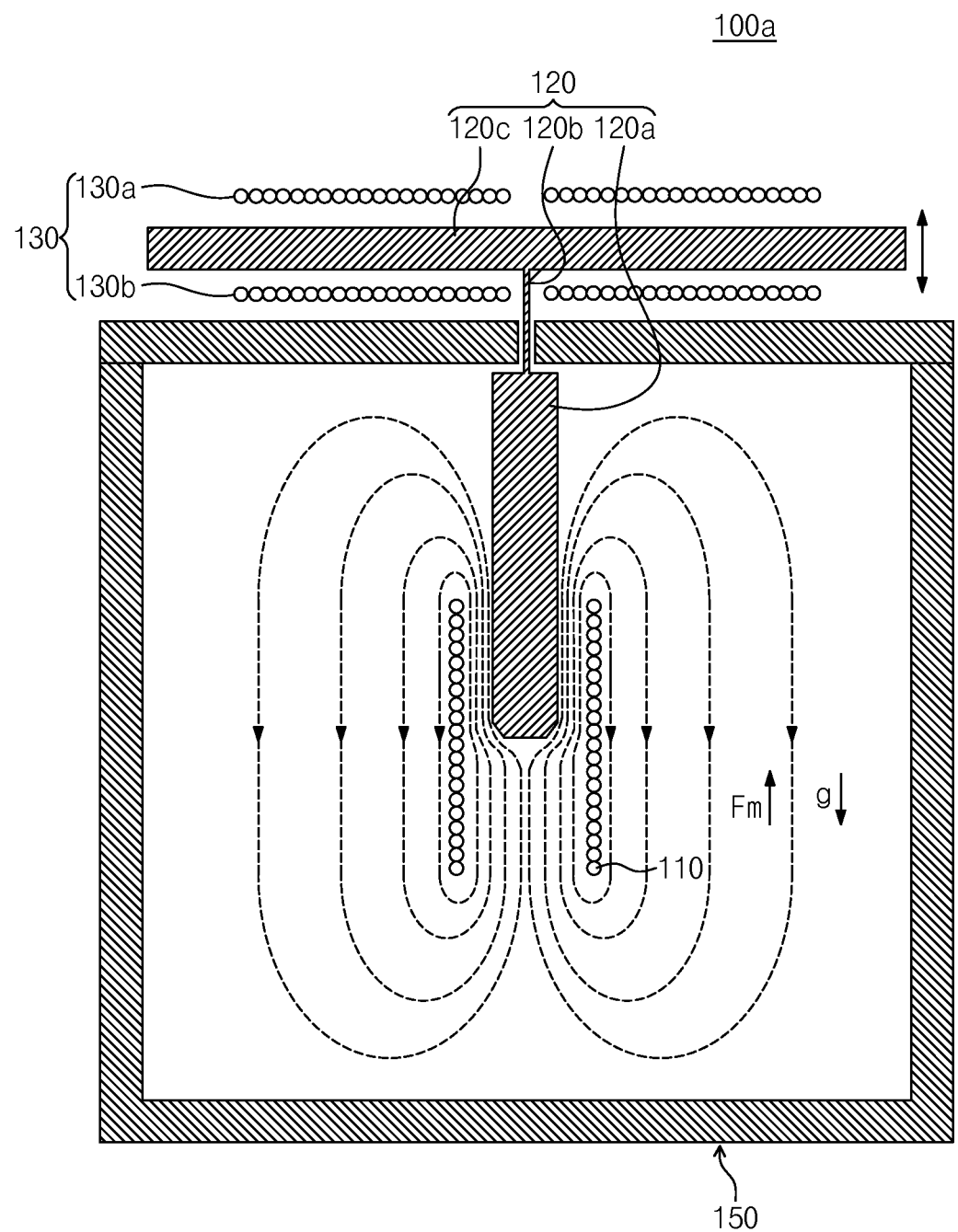
FIG. 2 is a conceptual diagram of a superconducting accelerometer according to an embodiment of the present invention.

FIG. 2 is a conceptual diagram of a superconducting accelerometer according to an embodiment of the present invention.

Figure 3A:
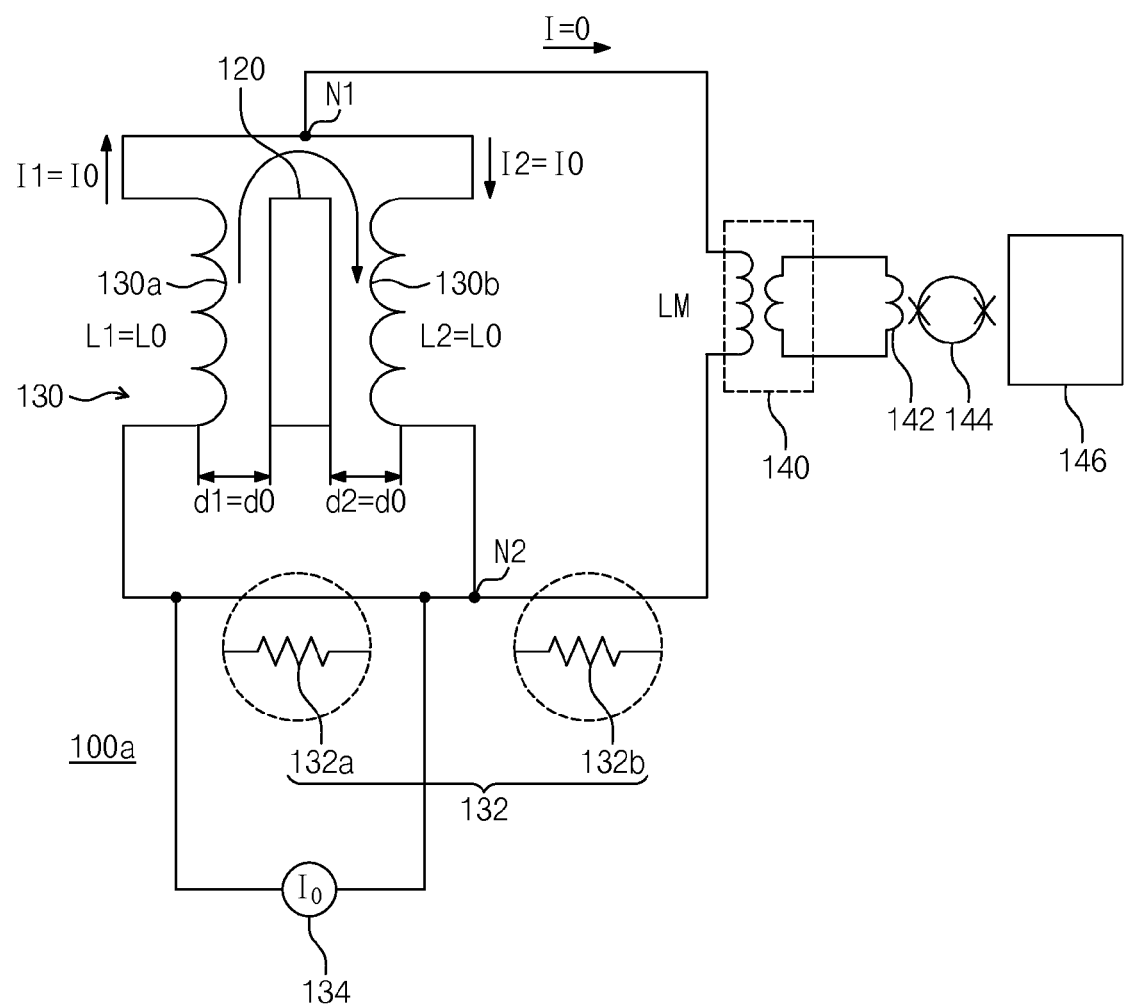
FIGS. 3A and 3B are equivalent circuit diagram of the superconducting accelerometer in FIG. 2.
Figure 3B:
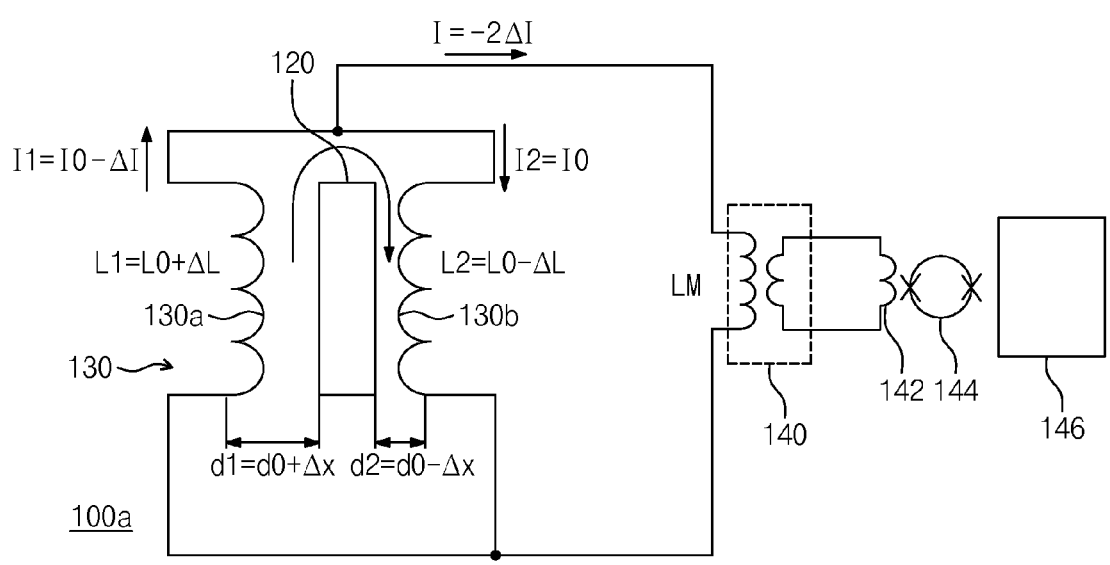

FIGS. 3A and 3B are equivalent circuit diagram of the superconducting accelerometer in FIG. 2.

Referring to FIG. 2 and FIGS. 3A and 3B, a superconductor accelerometer 100a includes a test mass 120 that includes a rod-shaped body part 120a and a disc-shaped coupling art 120c connected to the body part 120a and is made of a superconductor, a solenoid levitation coil 110 that is disposed to surround a portion of the body part 120a, magnetically levitates the test mass 120, and is made of a superconductor, a measurement superconductor coil 130 that is disposed at least one side of an upper portion and a lower portion of the coupling part 120c, and a SQUID sensor 144 that detects current flowing to the measurement superconductor coil 130.

The test mass 120 may include a neck part 120b disposed between the body part 120a and the coupling part 120c. The test mass 120 may include a body part 120a, a neck part 120b, and a coupling part 120c that are continuously connected to each other. The body part 120 is cylindrical and has a first diameter. The neck part 120b is cylindrical and has a second diameter. The coupling part 120c is disc-shaped and has a third diameter. The first diameter is greater than the second diameter and smaller than the third diameter. The center of mass exists at the side of the body part 120a on the central axis. Thus, the test mass 120 may have stability with respect to perturbation during levitation. The body part 120a and the neck part 120b are integrated in one part, and an upper end of the neck part 120b may have a male screw structure. Accordingly, the upper end of the neck part 120b may be coupled with a female screw hole formed in the center of the coupling part 120c. A lower edge of the body part 120a may be rounded.

A superconductor shielding case 150 may surround and magnetically shield a portion of the neck part 120b, the body part 120a, and the solenoid levitation coil 110. The superconductor shielding case 150 may be cylindrical.

The solenoid levitation coil 110 may be disposed to surround a lower end of the body part 120a inside the superconductor shielding case 150. A magnetic field established by the solenoid levitation coil 110 cannot permeate the body part 120a. The superconductor shield case 150 may have a through-hole formed at a position where the neck part 120b passes, preventing the magnetic field from reaching the measurement superconductor coil 130. Thus, the magnetic field cannot pass through the through-hole because a diameter of the body part 120 is greater than that of the neck part 120b.

The measurement superconductor coil 130 may be disposed on an upper surface and a lower surface of the coupling part 120a. The measurement superconductor coil 130 may include a measurement superconductor upper coil 130a and a measurement superconductor lower coil 130b. The measurement superconductor upper coil 130a may have the same structure as the measurement superconductor lower coil 130b. The measurement superconductor coil 130 may include heat switches 132a and 132b. The measurement superconductor coil 130 may be a pancake-type spiral coil. The measurement superconductor upper coil 130a and the measurement superconductor lower coil 130b may be connected to each other to form a first closed loop. The first heat switch 132a may be disposed in the vicinity of the first closed loop. One end of the measurement superconductor upper coil 130a and one end of the measurement superconductor lower coil 130b are connected at a first node N1. The other end of the measurement superconductor upper coil 130a and the other end of the measurement superconductor lower coil 130b are connected at a second end N2. A new second loop may be formed to connect the first node N1 and the second node N2 to each other and to be connected to a primary coil of a voltage transformer 140. The second heat switch 132b may be disposed in the vicinity of the second loop.

The superconductor accelerometer 100a magnetically levitates the test mass 120 and stabilizes posture of the test mass 120 using the solenoid levitation coil 110 made of a superconductor. Acceleration variation of the test mass 120 causes variation of distance between the measurement superconductor coil 130 and the test mass 120, the variation of the distance causes variation of extremely stable superconducting permanent current, and the variation of the superconducting permanent current may be converted into a voltage using the SQUID sensor 144 that is the most sensitive magnetic sensor.

When the body part 120a is inserted into a central portion of the solenoid levitation coil 110, the body part 120a levitates magnetically. The body part 120a may be controlled in a vertical direction according to the magnitude of a magnetic field of the solenoid levitation coil 110. When the body part 120a leans to one side, lines of magnetic force are concentrated to push the body part 120a like the magnetic levitation effect. Accordingly, the body part 120a is disposed in the center of the solenoid levitation coil 110. As a result, the test mass 120 designed such that its center of mass exists in a lower side is prevented from perturbation to be stably supported by the solenoid levitation coil 110.

The test mass 120 levitated stably by the solenoid levitation coil 110 is controlled to come close to the pancake-type measurement superconductor coil 130. The test mass 120 moves due to the acceleration variation, distance varation is generated, and current variation occurs. The varied current is transferred to a secondary coil of the voltage transformer 140 or a current transformer, and the current transferred to the secondary coil of the voltage transformer 140 is output as a voltage through a pick-up coil 142 and the SQUID sensor 144.

If distances between the test mass 120 and the measurement superconductor coils 130 of the same standard are equal to each other while the measurement superconductor coils 130 are connected in parallel, superconducting permanent current flows only within the first closed loop including the measurement superconductor coil 130.

In this state, when the test mass 120 leans to one side due to the variation of the acceleration, inductance of a coil with decreased distance between the measurement superconductor coil 130b and the test mass 120 decreases. Thus, current of the coil increases by $\Delta I$.

On the other hand, inductance of a coil with increased distance between the measurement superconductor coil 130b and the test mass 120 increases. Thus, current of the coil decreases by $\Delta I$.

This current difference ($2\Delta I$) flows to the second loop where the voltage transformer is disposed. Thus, the SQUID sensor 144 detects double current variation.

As a result, the measurement superconductor coils 130 are mounted at both sides of the test mass 120 to improve measurement sensitivity.

Figure 4A:
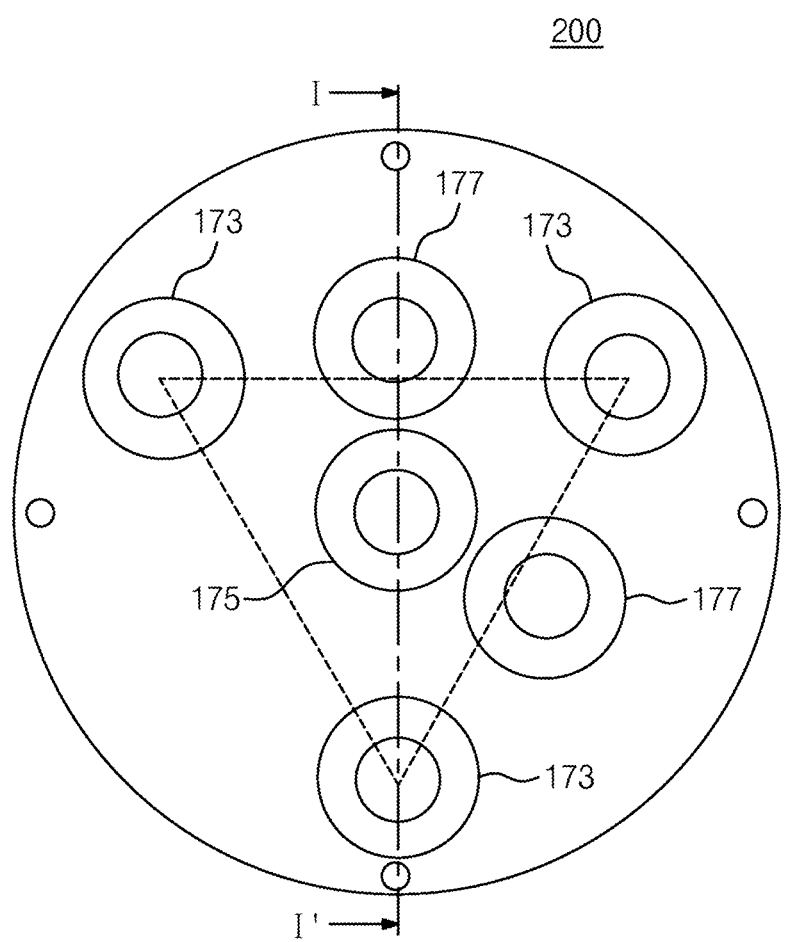
FIG. 4A is a top plan view of an acceleration measurement device according to an embodiment of the present invention.

FIG. 4A is a top plan view of an acceleration measurement device according to an embodiment of the present invention.

Figure 4B:
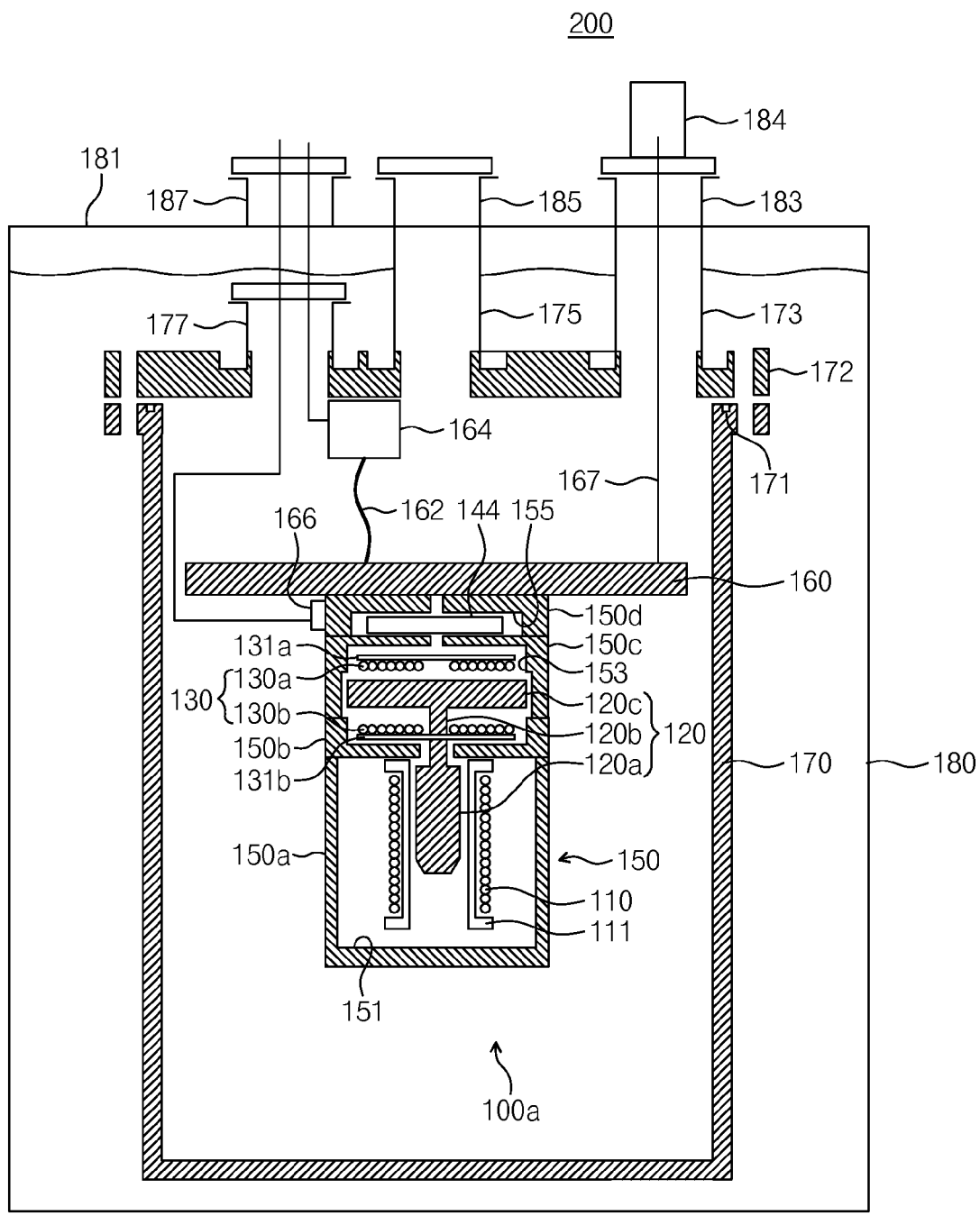
FIG. 4B is a cross-portional view taken along the line I-I' in FIG. 4A.

FIG. 4B is a cross-portional view taken along the line I-I' in FIG. 4A.

Referring to FIGS. 4A and 4B, an acceleration measurement device 200 includes a dewar 180 in which a coolant is stored, a sealing can 170 disposed inside the dewar 180 and filled with a helium gas after being vacuum-exhausted, and an acceleration sensor 100a disposed inside the sealing can 170.

The acceleration sensor 100a includes a test mass 120 that includes a rod-shaped body part 120a, a neck part 120b connected to the body part 120a, and a disc-shaped coupling part 120c connected to the neck part 120b, a solenoid levitation coil 110 that is disposed to surround a portion of the body part 120a, is adapted to magnetically levitate the test mass 120, and is made of a superconductor, a measurement superconductor coil 130 that is disposed at least one side of an upper portion and a lower portion of the coupling part 120c, and a SQUID sensor 144 that is adapted to detect current depending on distance between the test mass and the measurement superconductor coil 130.

The dewar 180 is a cooling device in which a liquid coolant is stored. The dewar 180 may include a vacuum layer and a thermal shielding layer. The dewar 180 may be cylindrical and include a cover 181. Ports 183, 185, and 187 may be disposed on the cover 181 of the dewar 180 to fix pipes extending from the sealing can 170.

The sealing can 170 may be made of a niobium (Nb) material and store the acceleration sensor 100a therein. The sealing can 170 may be cylindrical. The inside of the sealing can 170 may be filled with a helium gas after being vacuum-exhausted. Thus, inner pressure of the sealing can 170 may be constant.

The sealing can 170 may include a cylindrical body part and a top plate 172. The body part and the top plate 172 may be sealed with indium 171. A vacuum pipe 175 may be disposed on a through-hole formed in the center of the top plate 172 and extend perpendicularly to be connected to the port 185 disposed on the cover 181 of the dewar 180.

A level-maintaining pipe 173 may be disposed on the top plate 172 of the sealing can 170. The level-maintaining pipe 173 may extend perpendicularly from a corner of a regular triangle matching the center of the top plate 172. The level-maintaining pipe 173 may be disposed on a through-hole formed on the top plate 172 and may be connected to the port 183 disposed on the cover 181 of the dewar 173. A connector port 177 for electrical connection may be disposed on the top plate 172 of the sealing can 170.

A disc-shaped fixing plate 160 may be horizontally disposed inside the sealing can 170. The fixing plate 160 may be stainless steel or a superconductor. A superconductor shielding case 150 may be mounted on a lower portion of the fixing plate 160. Three level-maintaining strings 167 extending perpendicularly from the corner of the regular triangle matching the center of the fixing plate 160 may extend through the inside of the level-maintaining pipe 173. Each of lengths of the level-maintaining strings 167 may be adjusted through an adjustment part 184 mounted on the top plate 181 of the dewar 180. Thus, levels of the fixing plate 160 and the superconductor shielding case 150 may be adjusted.

The superconductor shielding case 150 may be disposed inside the sealing can 170 and surround and magnetically shield a portion of the neck part 120b, the body part 120a, and the solenoid levitation coil 110.

A temperature control heater 164 may be disposed inside the sealing can 170. The temperature control heater 164 may be mounted on a lower surface of the top plate 172 of the sealing can 170. Heat energy of the temperature control heater 164 may be transferred to the fixing plate 160 through a heat carrier 162 of a flexible material. The heat carrier 160 may heat the fixing plate 160 and the superconductor shielding case 150. A temperature sensor 166 may be mounted on an external side surface of the superconductor shielding case 150. The temperature sensor 166 detects temperature of the superconductor shielding case 150. When the temperature of the superconductor shielding case 150 drops below a predetermined reference temperature, the temperature control heater 164 may operate to allow the temperature of the superconductor shielding case 150 to be maintained at the reference temperature.

The superconductor shielding case 150 may be cylindrical. The superconductor shielding case 150 may includes a first space 151 in which the body part 120a of the test mass 120 and the solenoid levitation coil 110 are stored, a second space 153 in which the coupling part 120c of the test mass 120 is stored, and a third space 155 in which the SQUID sensor 144 is stored. The measurement superconductor coil 130 may be disposed in the second space 153. A coil bobbin 111 on which the solenoid levitation coil 110 is wound may be disposed in the first space 111. The coil bobbin 111 may be cylindrical and may be made of a ceramic material.

The superconductor shielding case 150 may include first to fourth parts 150a to 150d that are stacked in the order named. The first to fourth parts 150a to 150d may be aligned with each other to be coupled with each other. The first part 150a may be in the form of a cylinder whose one end is closed and the other end is opened. The solenoid levitation coil 110 wound on the coil bobbin 111 may be disposed inside the first part 150a.

The second part 150b may be in the form of a cylinder which has a through-hole formed in its center and whose one end is opened and the other end is closed. The second part 150b may be stacked on the other end of the first part 150a such the opened end of the second part 150b faces upward. The neck part 120b is inserted into the through-hole, and the body part 120b is disposed inside the first part 150a.

The third part 150c may be in the form of a cylinder whose one end is opened and the other end is closed. The third part 150c may be disposed such that the closed end of the third part 150c faces upward. The coupling part 120c may be disposed inside the third part 150c.

The measurement superconductor coils 130 may be disposed on an upper surface and a lower surface of the coupling part 120c, respectively. The measurement superconductor coil 130 may be a pancake-type spiral coil. The measurement superconductor coil 130 may include a measurement superconductor upper coil 130a and a measurement superconductor lower coil 130b. The measurement superconductor coil 130 may be fixed to ceramic bases 131a and 131b.

The fourth part 150d may be in the form of a cylinder whose one end is opened and the other end is closed. The fourth part 150d may be disposed such that the closed end of the fourth part 150d faces upward. The SQUID sensor 144 may be disposed inside the fourth part 150d.

As described above, a superconducting accelerometer according to an embodiment of the present invention employs a magnetic levitation technique without combination with a mechanical spring. Thus, acceleration may be measured more precisely.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the present invention.

What is claimed is:
1. A superconducting accelerometer comprising:
  a test mass including a rod-shaped body part and a disc-shaped coupling part connected to the body part, the test mass being made of a superconductor;
  a solenoid levitation coil disposed to surround a portion of the body part and adapted to magnetically levitate the test mass, the solenoid levitation coil being made of a superconductor;
  a measurement superconductor coil disposed at at least one side of an upper portion and a lower portion of the coupling part; and a SQUID sensor adapted to detect current depending on variation of a distance between the test mass and the measurement superconductor coil.

2. The superconducting accelerometer as set forth in claim 1, wherein the test mass further comprises a neck part disposed between the body part and the coupling part.

3. The superconducting accelerometer as set forth in claim 2, further comprising:
a superconductor shielding case adapted to surround and magnetically shield a portion of the neck part, the body part, and the solenoid levitation coil.

4. The superconducting accelerometer as set forth in claim 3, further comprising:
a coil bobbin disposed inside the solenoid levitation coil, wherein the coil bobbin is made of a ceramic material and fixed to the superconductor shielding case, and
wherein the solenoid levitation coil is wound on the coil bobbin.

5. The superconducting accelerometer as set forth in claim 1, wherein the measurement superconductor coil is disposed at an upper portion and a lower portion of the coupling part, and
wherein the measurement superconductor coil is a pancake-type spiral coil.

6. The superconducting accelerometer as set forth in claim 3, wherein the superconductor shielding case comprises:
a first space in which the body part of the test mass and the solenoid levitation coil are stored;
a second space in which the coupling part of the test mass is stored; and
a third space in which the SQUID sensor is stored.

7. The superconducting accelerometer as set forth in claim 1, further comprising:
a sealing can adapted to vacuum-seal the test mass, the solenoid levitation coil, the measurement superconductor coil, and the SQUID sensor,
wherein the inside of the sealing can is filled with a helium gas after being vacuum-exhausted.

8. The superconducting accelerometer as set forth in claim 7, wherein a material of the sealing can is niobium (Nb).

9. The superconducting accelerometer as set forth in claim 7, further comprising:
a superconductor shielding case disposed inside the sealing can and adapted to surround and magnetically shield a portion of the neck part, the body part, and the solenoid levitation coil;
a fixing plate coupled with an upper surface of the superconductor shielding case;
a temperature control heater disposed inside the sealing can;
a heat carrier of a flexible material adapted to thermally connect the temperature control heater and the fixing plate to each other; and
a temperature sensor coupled with the superconductor shielding case.

10. An acceleration measurement device comprising:
a dewar in which a coolant is stored;
a sealing can disposed inside the dewar and filled with a helium gas after being vacuum-exhausted; and
an acceleration sensor disposed inside the sealing can,
wherein the acceleration sensor comprises:
a test mass including a rod-shaped body part, a neck part connected to the body part, and a disc-shaped coupling part connected to the neck part;
a solenoid levitation coil disposed to surround a portion of the body part and adapted to magnetically levitate the test mass, the solenoid levitation coil being made of a superconductor;
a measurement superconductor coil disposed at at least one side of an upper portion and a lower portion of the coupling part; and
a SQUID sensor adapted to detect current depending on distance between the test mass and the measurement superconductor coil.

11. The acceleration measurement device as set forth in claim 10, further comprising:
a superconductor shielding case disposed inside the sealing can and adapted to surround and magnetically shield a portion of the neck part, the body part, and the solenoid levitation coil; and
a fixing plate coupled with an upper surface of the superconductor shielding case.

12. The acceleration measurement device as set forth in claim 10, further comprising:
three level-maintaining strings connected to a corner of a regular triangle matching a disc-shaped fixing plate; and
level-maintaining pipes connecting the sealing can with the dewar to each other to extend the level-maintaining strings, respectively,
wherein a level of the sealing plate is adjusted by adjusting lengths of the level-maintaining strings.

13. The acceleration measurement device as set forth in claim 10, further comprising:
a vacuum pipe connecting the sealing can with the dewar to each other,
wherein the inside of the sealing can is vacuum-exhausted through the vacuum pipe.

14. An acceleration measurement method comprising:
cooling a test mass including a rod-shaped body part, a neck part connected to the body part, and a disc-shaped coupling part connected to the neck part and made of a superconductor, a solenoid levitation coil disposed to surround a portion of the body part and made of a superconductor, and a measurement superconductor coil;
applying first permanent current to the solenoid levitation coil to levitate the test mass;
applying second permanent current to the measurement superconductor coil disposed at least one side of an upper portion and a lower portion of the coupling part; and
detecting variation of the second permanent current depending on acceleration variation by the SQUID sensor.

15. The acceleration measurement method as set forth in claim 14, further comprising:
adjusting the solenoid levitation coil, the test mass, and the measurement superconductor coil to be maintained at constant temperature below critical temperature;
vacuum-exhausting a sealing can disposed inside a dewar in which a coolant is stored before filling the sealing can with a helium gas; and
maintaining levels of the solenoid levitation coil, the test mass, and the measurement superconductor coil.

16. The acceleration measurement method as set forth in claim 14, wherein applying the first permanent current to the solenoid levitation coil to levitate the test mass comprises:
heating a portion of the solenoid levitation coil to critical temperature or above;
applying current using a current source; and
removing the current source.

17. The acceleration measurement method as set forth in claim 14, wherein applying the second permanent current to the measurement superconductor coil comprises:
   heating a portion of the measurement superconductor coil to critical temperature or above;
   applying current using a current source; and
   removing the current source.

\* \* \* \* \*